US010199239B2

(12) United States Patent
Chiu et al.

(10) Patent No.: US 10,199,239 B2
(45) Date of Patent: Feb. 5, 2019

(54) PACKAGE STRUCTURE AND FABRICATION METHOD THEREOF

(71) Applicant: Siliconware Precision Industries Co., Ltd., Taichung (TW)

(72) Inventors: Chi-Hsin Chiu, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/823,341

(22) Filed: Aug. 11, 2015

(65) Prior Publication Data

US 2016/0079136 A1 Mar. 17, 2016

(30) Foreign Application Priority Data

Sep. 11, 2014 (TW) .............................. 103131299 A

(51) Int. Cl.
*H01L 21/52* (2006.01)
*H01L 21/78* (2006.01)
(Continued)

(52) U.S. Cl.
CPC .............. *H01L 21/52* (2013.01); *H01L 21/78* (2013.01); *H01L 23/5389* (2013.01); *H01L 24/19* (2013.01); *H01L 24/20* (2013.01); *H01L 24/97* (2013.01); *H01L 21/568* (2013.01); *H01L 23/49816* (2013.01); *H01L 2224/04105* (2013.01); *H01L 2224/12105* (2013.01); *H01L 2224/32225* (2013.01); *H01L 2224/32245* (2013.01); *H01L 2224/73267* (2013.01);
(Continued)

(58) Field of Classification Search
CPC . H01L 21/52; H01L 21/563; H01L 21/76829; H01L 21/76895; H01L 23/3114; H01L 23/49811; H01L 23/49827; H01L 23/49838; H01L 2224/18; H01L 21/568; H01L 23/5386
See application file for complete search history.

(56) References Cited

U.S. PATENT DOCUMENTS

2008/0217761 A1* 9/2008 Yang ........................ H01L 24/24
257/700
2011/0175213 A1* 7/2011 Mori ........................ H01L 23/13
257/675
(Continued)

*Primary Examiner* — Allen Parker
*Assistant Examiner* — Frederick B Hargrove
(74) *Attorney, Agent, or Firm* — Mintz Levin Cohn Ferris Glovsky and Popeo, P.C.; Peter F. Corless; Steven M. Jensen

(57) ABSTRACT

A package structure is provided, which includes: a frame having a cavity penetrating therethrough; a semiconductor chip received in the cavity of the frame, wherein the semiconductor chip has opposite active and inactive surfaces exposed from the cavity of the frame; a dielectric layer formed in the cavity to contact and fix in position the semiconductor chip, wherein a surface of the dielectric layer is flush with a first surface of the frame toward which the active surface of the semiconductor chip faces; and a circuit structure formed on the surface of the dielectric layer flush with the first surface of the frame and electrically connected to the active surface of the semiconductor chip, thereby saving the fabrication cost and reducing the thickness of the package structure.

7 Claims, 9 Drawing Sheets

(51) Int. Cl.
*H01L 23/538* (2006.01)
*H01L 23/00* (2006.01)
H01L 23/498 (2006.01)
H01L 21/56 (2006.01)

(52) U.S. Cl.
CPC ............... *H01L 2224/8203* (2013.01); *H01L 2924/18162* (2013.01); *H01L 2924/3511* (2013.01)

(56) References Cited

U.S. PATENT DOCUMENTS

| | | | |
|---|---|---|---|
| 2011/0215450 A1* | 9/2011 | Chi | H01L 23/48 257/660 |
| 2013/0147054 A1* | 6/2013 | Lin | H01L 24/96 257/774 |
| 2014/0110856 A1* | 4/2014 | Lin | H01L 24/19 257/774 |
| 2015/0115420 A1* | 4/2015 | Kalandar | H01L 21/4825 257/666 |
| 2015/0179481 A1* | 6/2015 | Lin | H01L 21/568 257/790 |
| 2015/0364394 A1* | 12/2015 | Lin | H01L 23/481 257/734 |

* cited by examiner

FIG. 2D"

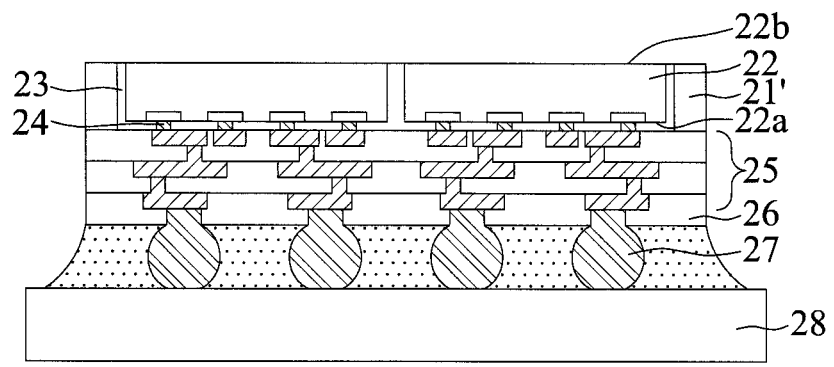
FIG. 2L'
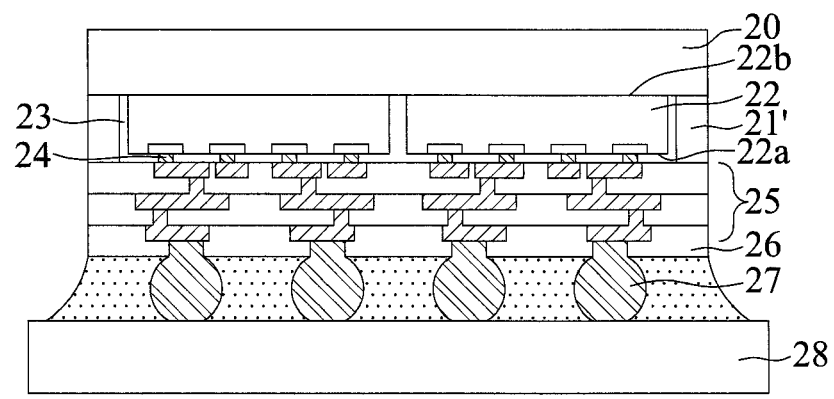
FIG. 2L"

PACKAGE STRUCTURE AND FABRICATION METHOD THEREOF

CROSS-REFERENCES TO RELATED APPLICATIONS

This application claims under 35 U.S.C. § 119(a) the benefit of Taiwanese Application No. 103131299, filed Sep. 11, 2014, the entire contents of which are incorporated herein by reference.

BACKGROUND OF THE INVENTION

1. Field of the Invention

The invention relates to package structures and fabrication methods thereof, and more particularly, to a package structure having a circuit structure and a fabrication method thereof.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

In a flip-chip packaging process, a big CTE (Coefficient of Thermal Expansion) mismatch between a chip and a packaging substrate adversely affects the formation of joints between conductive bumps of the chip and corresponding contacts of the packaging substrate, thus easily resulting in delamination of the conductive bumps from the packaging substrate. On the other hand, along with increased integration of integrated circuits, the CTE mismatch between the chip and the packaging substrate induces more thermal stresses and leads to more serious warpage, thereby reducing the product reliability and resulting in failure of a reliability test.

Accordingly, the process having an interposer structure composed of semiconductor material is provided. A silicon interposer is disposed between the packaging substrate and the semiconductor chip. Since the silicon interposer is close in material to the semiconductor chip, the above-described drawbacks caused by a CTE mismatch can be effectively overcome.

Referring to FIG. 1 illustrates a schematic cross-sectional view of a conventional package structure having a silicon interposer. Such a conventional package structure overcomes the above-described drawbacks. In addition, compared with a package structure having a semiconductor chip directly disposed on a packaging substrate, the conventional package structure of FIG. 1 has a reduced layout area.

For example, a packaging substrate generally has a minimum line width/pitch of 12/12 um. When the I/O count of a semiconductor chip increases, since the line width/pitch of the packaging substrate cannot be reduced, the area of the packaging substrate must be increased such that more circuits can be formed on the packaging substrate and electrically connected to the semiconductor chip having high I/O count. On the other hand, referring to FIG. 1, a plurality of semiconductor chips 11 are disposed on a silicon interposer 12 having through silicon vias (TSVs) 121 and the silicon interposer 12 is further disposed on a packaging substrate 13. As such, the semiconductor chips 11 are electrically connected to the packaging substrate 13 through the silicon interposer 12. Through a semiconductor process, the silicon interposer 12 can have a line width/pitch of 3/3 um or less. Therefore, the area of the silicon interposer 12 is sufficient for electrical connection with the semiconductor chips 11 having high I/O counts and hence the area of the packaging substrate 13 does not need to be increased. Further, the fine line width/pitch of the silicon interposer 12 facilitates to shorten the electrical transmission path. Therefore, compared with semiconductor chips directly disposed on a packaging substrate, the semiconductor chips 11 disposed on the silicon interposer 12 can achieve a higher electrical transmission speed (efficiency).

However, the TSVs 121 of the silicon interposer 12 used for electrically connecting the semiconductor chip 11 and the packaging substrate 13 incur a high fabrication cost. In addition, the silicon interposer 12 leads to an increase of the thickness of the final package structure.

Therefore, how to overcome the above-described drawbacks has become critical.

SUMMARY OF THE INVENTION

In view of the above-described drawbacks, the invention provides a package structure, which comprises: a frame having a cavity penetrating therethrough; at least a semiconductor chip received in the cavity of the frame, wherein the semiconductor chip has opposite active and inactive surfaces exposed from the cavity of the frame; a dielectric layer formed in the cavity to contact and fix in position the semiconductor chip, wherein a surface of the dielectric layer is flush with a first surface of the frame toward which the active surface of the semiconductor chip faces; and a circuit structure formed on the surface of the dielectric layer flush with the first surface of the frame and electrically connected to the active surface of the semiconductor chip.

In another embodiment, the invention further provides a package structure which comprises: a frame having a cavity penetrating therethrough; a semiconductor chip received in the cavity of the frame, wherein the semiconductor chip has opposite active and inactive surfaces exposed from the cavity of the frame; a dielectric layer formed in the cavity to contact and fix in position the semiconductor chip; a circuit structure formed on a surface of the dielectric layer toward which the active surface of the semiconductor chip faces and electrically connected to the active surface of the semiconductor chip; and a carrier disposed on the frame, the dielectric layer and the inactive surface of the semiconductor chip, wherein the frame and the carrier are not integrally formed.

The invention further provides a method for fabricating a package structure, which comprises the steps of: forming a frame on a carrier and disposing at least a semiconductor chip on the carrier, wherein the carrier has opposite first and second surfaces, the frame is formed on the first surface of the carrier and has a cavity exposing a portion of the first surface of the carrier, the frame and the carrier are not integrally formed, the semiconductor chip is received in the cavity of the frame and disposed on the portion of the first surface of the carrier exposed from the cavity and has an inactive surface attached to the first surface of the carrier and an active surface opposite to the inactive surface, and a dielectric layer is filled in the cavity to contact and fix in position the semiconductor chip; forming a circuit structure on the dielectric layer, wherein the circuit structure is electrically connected to the active surface of the semiconductor chip; and removing the carrier to expose the inactive surface of the semiconductor chip.

In an embodiment, forming the frame on the carrier and disposing the semiconductor chip on the carrier comprise the steps of: disposing the semiconductor chip on the carrier; disposing a cover board on the carrier, wherein the cover board has a recessed portion facing the carrier and receiving the semiconductor chip; removing a portion of the cover board to expose the semiconductor chip, so as for the remaining portion of the cover board to form the frame having the cavity formed from the recessed portion; and forming in the cavity of the frame the dielectric layer exposing at least a portion of the active surface of the semiconductor chip.

In another embodiment, forming the frame and the dielectric layer comprise the steps of: disposing the semiconductor chip and a cover board having a recessed portion on the carrier, wherein the recessed portion of the cover board faces the carrier for the semiconductor chip to be received in the recessed portion and attached to a bottom surface of the recessed portion, allowing the cover board to be positioned over and not in contact with the carrier; forming the dielectric layer in the recessed portion and between the cover board and the carrier to contact and fix in position the semiconductor chip; and removing a portion of the cover board to expose the semiconductor chip, so as for the remaining portion of the cover board to form the frame.

Therefore, the invention replaces the high cost conventional interposer with a low cost circuit structure and dispenses with the conventional solder balls formed between the semiconductor chip and the interposer, thereby effectively reducing the fabrication cost and the thickness of the package structure.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 1:
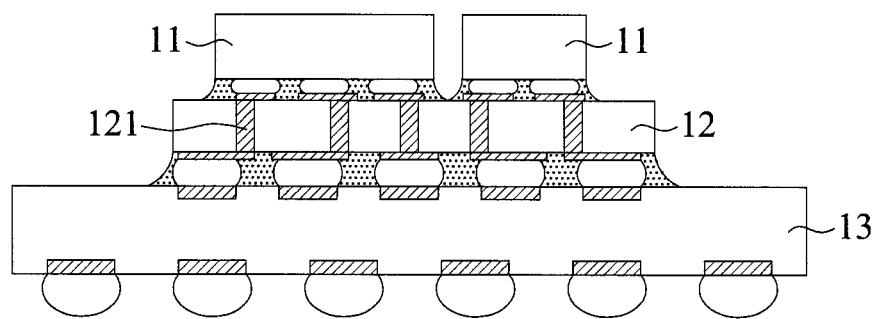
FIG. 1 is a schematic cross-sectional view of a conventional package structure having a silicon interposer.
Figure 2A:
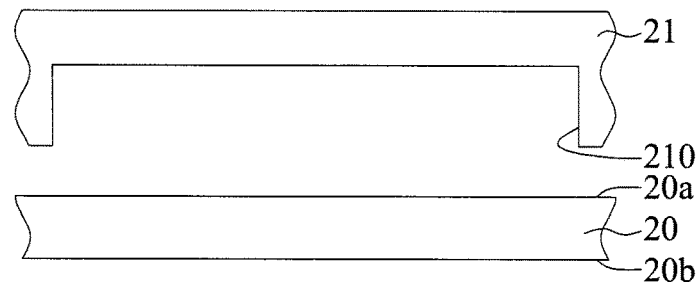
FIGS. 2A to 2L' are schematic cross-sectional views showing a method for fabricating a package structure according to the present invention, wherein FIG. 2C' shows another embodiment of FIG. 2C, FIGS. 2D' and 2D" show different embodiments of FIG. 2D, FIG. 2L' shows a package structure continued from FIG. 2D", and FIG. 2L" shows another embodiment of the package structure.
Figure 2B:
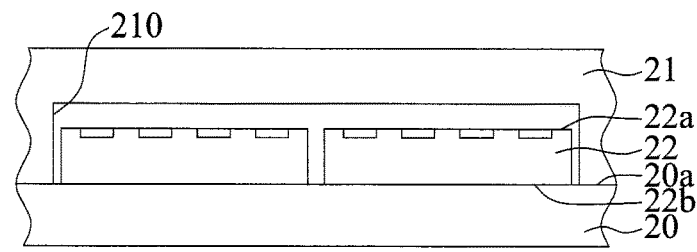
Figure 2C:
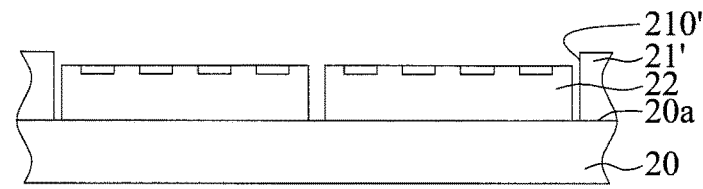
Figure 2C:
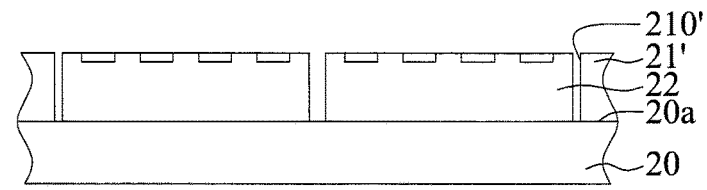
Figure 2D:
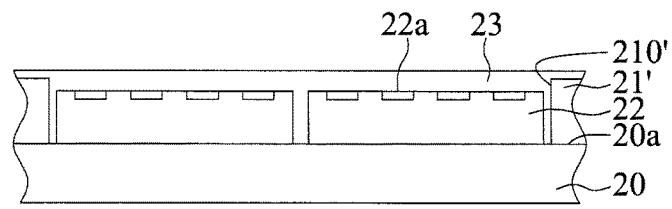
Figure 2D:
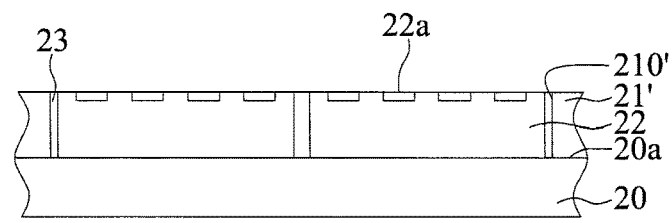

FIGS. 2A to 2L are schematic cross-sectional views showing a method for fabricating a package structure according to the invention, wherein FIG. 2C' shows another embodiment of FIG. 2C, and FIGS. 2D' and 2D" show different embodiments of FIG. 2D.

Referring to FIG. 2A, a carrier 20 and a cover board 21 are provided. The carrier 20 has a first surface 20a and a second surface 20b opposite to the first surface 20a. The cover board 21 has a recessed portion 210. The carrier 20 and the cover board 21 are not integrally formed.

The carrier 20 and the cover board 21 can be made of an organic material such as BCB (Benzocyclobutene) or polyimide, or an inorganic material such as SiC or $SiO_2$. The carrier 20 and the cover board 21 can be made of metal, glass, ceramic, or a semiconductor material such as Si or GaAs.

Referring to FIG. 2B, one or more semiconductor chips 22 are disposed on the first surface 20a of the carrier 20. The semiconductor chips 22 can have different sizes and thicknesses (also called "heights"). Each of the semiconductor chips 22 has opposite active and inactive surfaces 22a, 22b and is disposed on the first surface 20a of the carrier 20 via the inactive surface 22b thereof. In an embodiment, an adhesive layer or a die attachment film (not shown) is formed for disposing the semiconductor chips 22 on the first surface 20a of the carrier 20. In another embodiment, a promoter layer (not shown) and a photosensitive material layer (not shown) are sequentially formed on the first surface 20a of the carrier 20 for disposing the semiconductor chips 22 on the first surface 20a of the carrier 20. The promoter layer causes the photosensitive material layer such as polybenzobisoxazole (PBO) to be more adhesive to the carrier 20 than to the semiconductor chips 22.

The photosensitive material layer can be a photosensitive spin-on dielectric (PSOD) material such as a photodefinable polybenzobisoxazole (PBO) precursor, or a photodefinable material such as polyimide precursor, or a photosensitive patternable material such as a polysilsesquiazane composition.

Then, the cover board 21 is disposed on the carrier 20, with the recessed portion 210 facing the carrier 20 for receiving the semiconductor chips 22 therein. The cover board 21 is disposed on the carrier 20 by fusion bonding or adhesion.

Referring to FIG. 2C, the cover board 21 is partially removed by grinding so as to expose the semiconductor chips 22. The remaining portion of the cover board 21 is used to form a frame 21' having a cavity 210' formed from the recessed portion 210, allowing a portion of the first surface 20a of the carrier 20 to be exposed from the cavity 210'. In the present embodiment, the frame 21' is higher than the semiconductor chips 22.

In another embodiment, referring to FIG. 2C', the frame 21' and the semiconductor chips 22 have the same height.

Referring to FIG. 2D, a dielectric layer 23 is formed on the frame 21' and the active surfaces 22a of the semiconductor chips 22 and filled in the cavity 210' so as to cover the frame 21' and the semiconductor chips 22. The dielectric layer 23 can be a photosensitive dry film. The dielectric layer 23 can be made of an organic material such as polyimide, PBO (Polybenzobisoxazole) or BCB (Benzocyclobutene), or an inorganic material such as silicon oxide or silicon nitride.

In another embodiment, referring to FIG. 2D', the frame 21' and the dielectric layer 23 of FIG. 2D are partially removed by grinding so as to make a surface of the dielectric layer 23 flush with a first surface of the frame 21' toward which the active surfaces 22a of the semiconductor chips 22 faces.

In a further embodiment, referring to FIG. 2D", the frame 21' is higher than the semiconductor chips 22, such that the dielectric layer 23 covers the active surface 22a of the semiconductor chips 22 and a surface of be dielectric layer 23 is flush with the first surface of the frame 21' toward which the active surfaces 22a of the semiconductor chips 22 faces. Alternatively, the dielectric layer 23 of FIG. 2D can be partially removed by grinding so as for a surface of the dielectric layer 23 to be flush with the surface of the frame 21' toward which the active surfaces 22a of the semiconductor chips 22 faces.

Figure 2E:
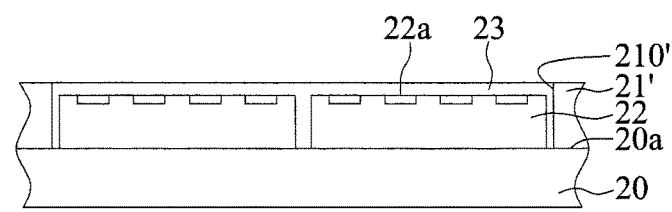
Figure 2E:
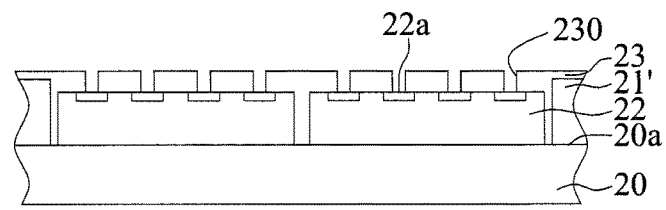

Referring to FIG. 2E, continued from FIG. 2D, a plurality of openings 230 are formed in the dielectric layer 23 to expose the active surfaces 22a of the semiconductor chips 22.

Figure 2F:
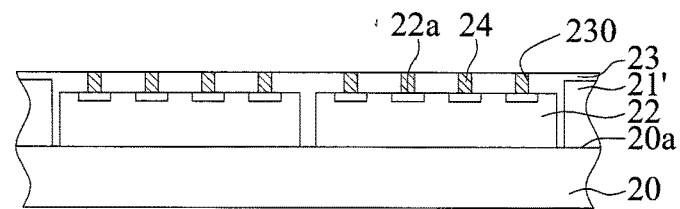

Referring to FIG. 2F, a plurality of conductors 24 are formed in the openings 230 and electrically connected to the active surfaces 22a of the semiconductor chips 22.

Figure 2G:
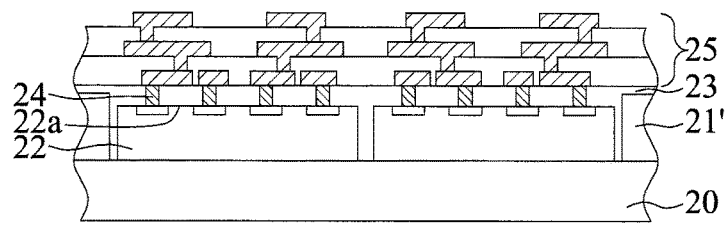

Referring to FIG. 2G a circuit structure 25, for example, a redistribution layer, is formed on the dielectric layer 23 and electrically connected to the conductors 24 and the active surfaces 22a of the semiconductor chips 22. The redistribution layer can have a single circuit layer or a plurality of circuit layers, for example, three circuit layers of FIG. 2G. The conductors 24 and the first circuit layer in contact with the conductors 24 can be separately formed as in FIGS. 2F and 2G or simultaneously formed.

Figure 2H:
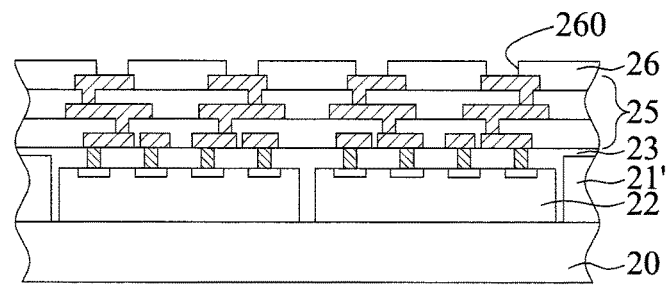

Referring to FIG. 2H, an insulating layer 26 having a plurality of openings 260 is formed on the circuit structure 25.

Figure 2I:
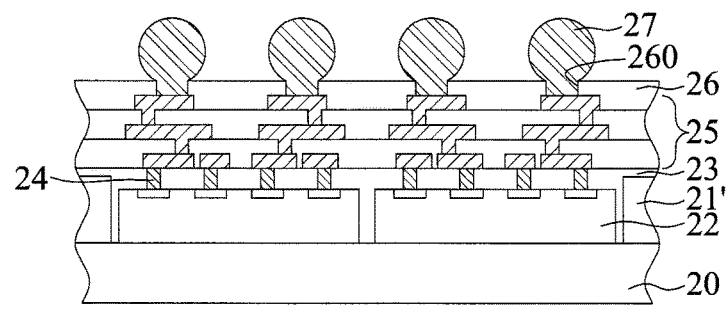

Referring to FIG. 2I, a plurality of conductive elements 27 such as solder balls are formed in the openings 260 of the insulating layer 26.

Figure 2J:
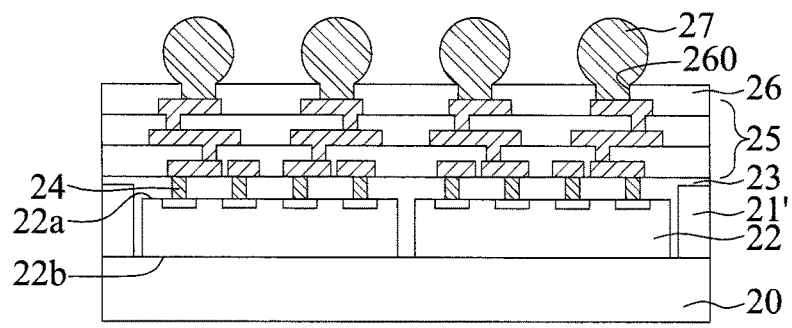

Referring to FIG. 2J, a singulation process is performed to form a package structure of the invention.

Figure 2K:
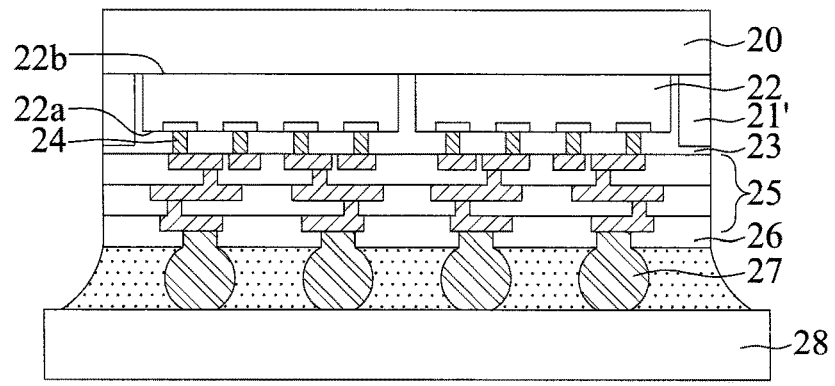

Referring to FIG. 2K, a substrate 28 is disposed on and electrically connected to the circuit structure 25 through the conductive elements 27. The substrate 28 can be a packaging substrate.

Figure 2L:
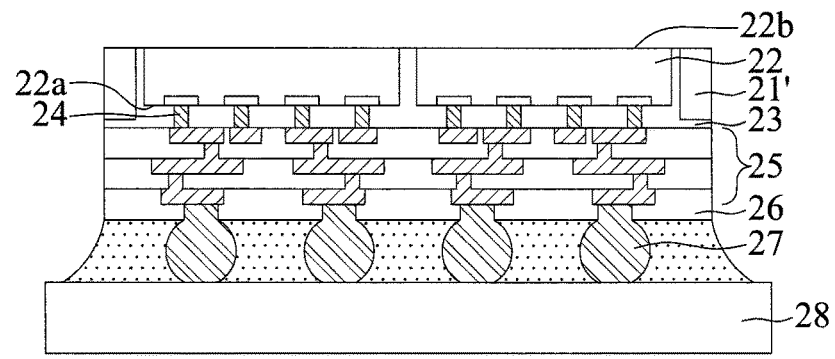

Referring to FIG. 2L, the carrier 20 is removed to expose the inactive surfaces 22b of the semiconductor chips 22. As such, a carrier-free package structure is obtained. In addition, if the die attachment film, the promoter layer or the photosensitive material layer is formed in FIG. 2B, removing the carrier 20 further includes removing these materials.

In another embodiment, a package structure of FIG. 2L' is obtained if the process is continued from FIG. 2D". Referring to FIG. 2L', the dielectric layer 23 is flush with the surface of the frame 21' at the side of the active surfaces 22a of the semiconductor chips 22 and covers the active surfaces 22a of the semiconductor chips 22. A plurality of conductors 24 are formed in the dielectric layer 23 and electrically connected to the active surfaces 22a of the semiconductor chips 22. The circuit structure 25 contacts the dielectric layer 23 and is electrically connected to the conductors 24. In a further embodiment, referring to FIG. 2L", the package structure further has the carrier 20 that is disposed on the frame 21', the dielectric layer 23 and the inactive surfaces 22b of the semiconductor chips 22. The frame 21' and the carrier 20 are not integrally formed.

Figure 3A:
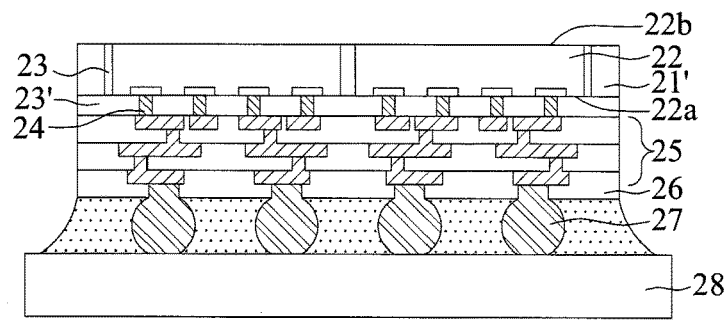
FIGS. 3A to 3B' are schematic cross-sectional views showing different embodiments of the package structure of the present invention.
Figure 3A:
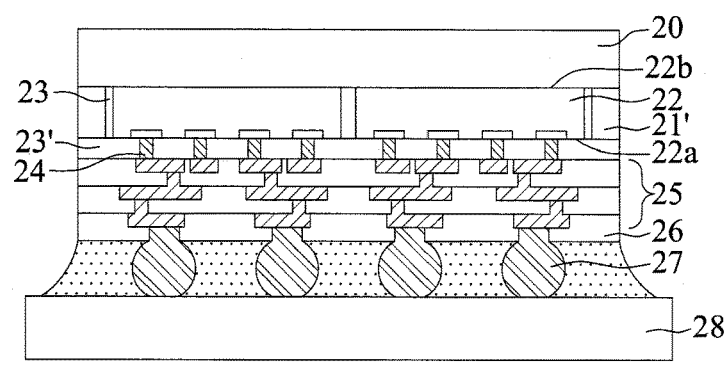
Figure 3B:
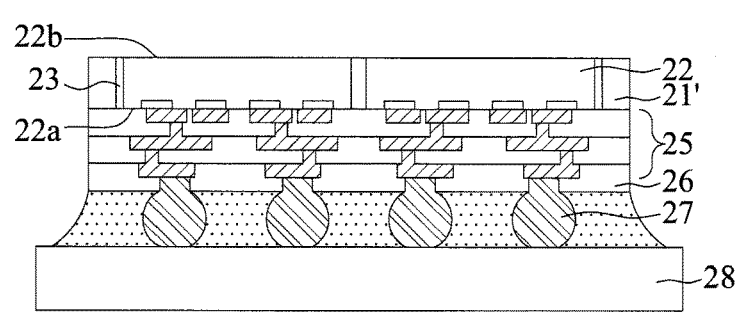
Figure 3B:
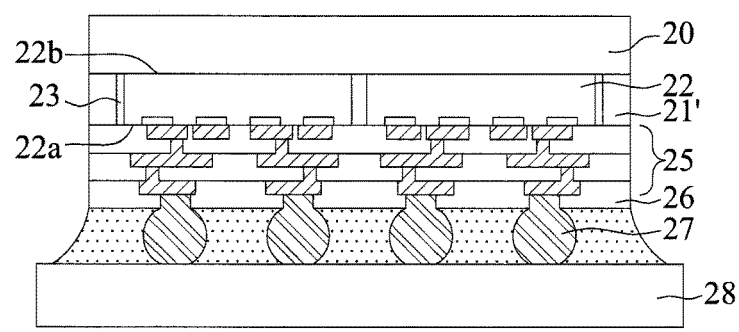

FIGS. 3A to 3B' are schematic cross-sectional views showing different embodiments of the package structure of the invention. Referring to FIG. 3A that is continued from step of FIG. 2D', after the dielectric layer 23 is formed, a built-up dielectric layer 23' is formed on the active surfaces 22a of the semiconductor chips 22 and the frame 21' and a plurality of conductors 24 are formed in the built-up dielectric layer 23'. Thereafter, the steps of FIGS. 2G to 2L are performed to form the circuit structure 25 electrically connecting the conductors 24, the insulating layer 26 and the conductive elements 27 and disposing on the substrate 28.

FIG. 3B shows another embodiment of FIG. 3A. Referring to FIG. 3B, the built-up dielectric layer 23' and the conductors 24 of FIG. 3A are dispensed with, and the circuit structure 25 is directly electrically connected to the active surfaces 22a of the semiconductor chips 22. In the present embodiment, both the active and inactive surfaces 22a, 22b of the semiconductor chips 22 are completely exposed from the dielectric layer 23, and the circuit structure 25 is in contact and electrical connection with the active surfaces 22a of the semiconductor chips 22.

Further, referring to FIGS. 3A' and 3B', the package structure has the carrier 20.

FIGS. 4A to 4E' are schematic cross-sectional views showing a method for fabricating a package structure according to another embodiment of the invention.

Figure 4A:
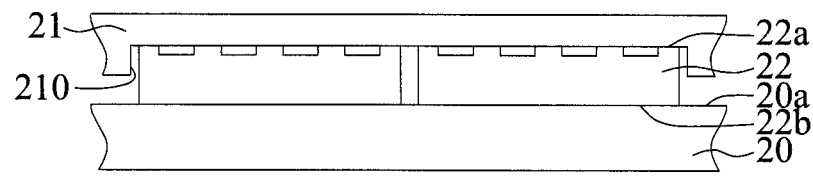
FIGS. 4A to 4E' are schematic cross-sectional views showing another method for fabricating a package structure according to the present invention, wherein FIGS. 4D' and 4E' show different embodiments of FIGS. 4D and 4E, respectively.

Referring to FIG. 4A, a carrier 20 is provided, which has a plurality of semiconductor chips 22 disposed thereon and a cover board 21 having a recessed portion 210 facing the carrier 20. The semiconductor chips 22 are received in the recessed portion and attached to a bottom surface of the recessed portion 210 of the cover board 21 so as to allow the cover board 21 to be positioned over and not in contact with the carrier 20.

Figure 4B:
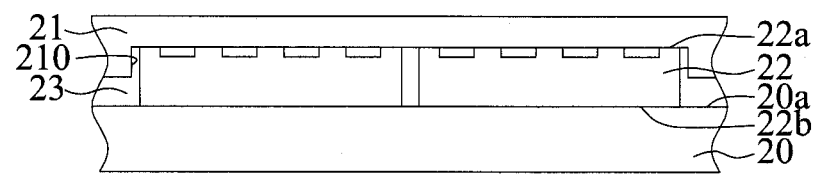

Referring to FIG. 4B, a dielectric layer 23 is formed in the recessed portion 210 and between the cover board 21 and the carrier 20 so as to contact and fix in position the semiconductor chips 22.

Figure 4C:
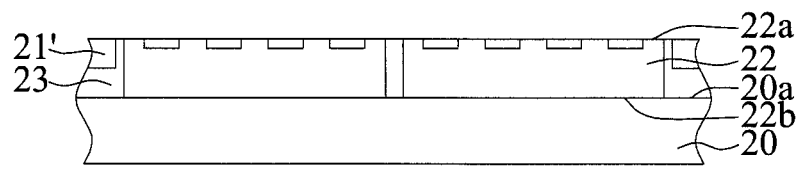

Referring to FIG. 4C, the cover board 21 is partially removed to expose the semiconductor chips 22. The remaining portion of the cover board 21 forms a frame 21'.

Figure 4D:
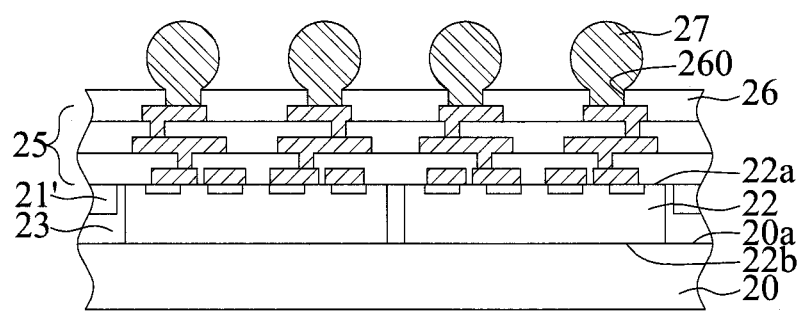
Figure 4D:
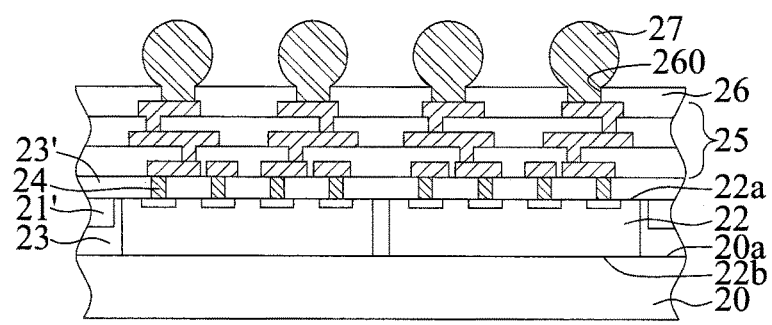

Then, referring to FIG. 4D, a circuit structure 25, an insulating layer 26 and a plurality of conductive elements 27 are sequentially formed on the dielectric layer 23.

Alternatively, referring to FIG. 4D', a built-up dielectric layer 23' is formed on the dielectric layer 23 first and then a circuit structure 25, an insulating layer 26 and a plurality of conductive elements 27 are sequentially formed on the built-up dielectric layer 23'.

Figure 4E:
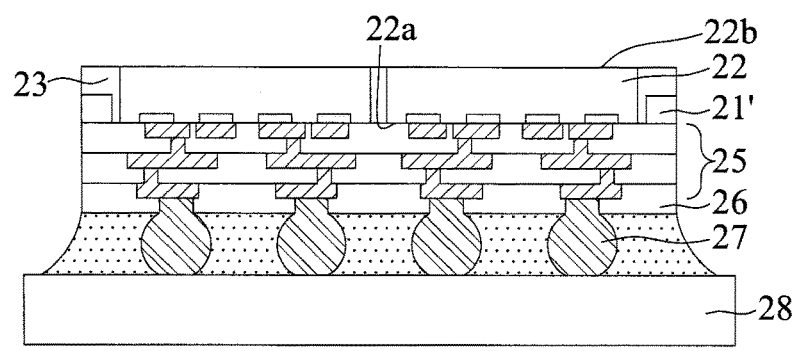
Figure 4E:
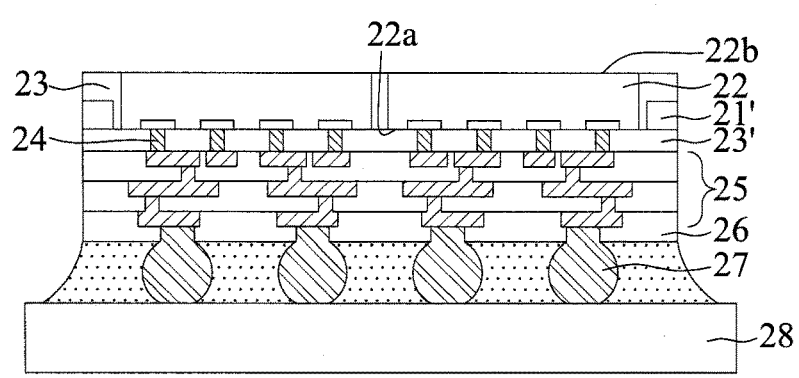

Referring to FIGS. 4E and 4E', a substrate 28 is disposed on and electrically connected to the circuit structure 25 through a plurality of conductive elements 27 and then the carrier 20 is removed to expose the inactive surfaces 22b of the semiconductor chips 22. As such, a package structure of the invention is obtained.

The invention further provides a package structure, which has: a frame 21' having a cavity 210' penetrating therethrough; at least a semiconductor chip 22 received in the cavity 210' of the frame 21', wherein the semiconductor chip 22 has opposite active and inactive surfaces 22a, 22b exposed from the cavity 210' of the frame 21; a dielectric layer 23 formed in the cavity 210' to contact and fix in position the semiconductor chip 22, wherein a surface of the dielectric layer 23 is flush with a first surface of the frame 21' toward which the active surface 22a of the semiconductor chip 22 faces; and a circuit structure 25 formed on the surface of the dielectric layer 23 flush with the first surface of the frame 21' and electrically connected to the active surface 22a of the semiconductor chip 22.

In an embodiment, referring to FIGS. 2J and 2K, the package structure further has a carrier 20 disposed on a second surface of the frame 21', the dielectric layer 23 and the inactive surface 22b of the semiconductor chip 22, wherein the frame 21' and the carrier 20 are not integrally formed.

In an embodiment, referring to FIG. 2L', the dielectric layer 23 covers the active surface 22a of the semiconductor chip 22. The package structure further has a plurality of conductors 24 formed in the dielectric layer 23 and electrically connected to the active surface 22a of the semiconductor chip 22. The circuit structure 25 contacts the dielectric layer 23 and is electrically connected to the conductors 24.

Referring to FIG. 2L", the dielectric layer 23 covers the active surface 22a of the semiconductor chip 22 and is flush with the surface of the frame 21' at the side of the active surface 22a of the semiconductor chip 22. The package structure further has a carrier 20, and a plurality of conductors 24 formed in the dielectric layer 23 and electrically connected to the active surface 22a of the semiconductor chip 22. The circuit structure 25 contacts the dielectric layer 23 and is electrically connected to the conductors 24.

In another embodiment, both the active and inactive surfaces 22a, 22b of the semiconductor chip 22 are completely exposed from the dielectric layer 23. The package structure further has a built-up dielectric layer 23' formed on the dielectric layer 23 at the side of the active surface 22a of the semiconductor chip 22 and a plurality of conductors 24 formed in the built-up dielectric layer 23'. The circuit structure 25 is formed on the built-up dielectric layer 23' and electrically connected to the active surface 22a of the semiconductor chip 22 through the conductors 24. In the present embodiment, referring to FIG. 3A, the frame 21', the semiconductor chip 22 and the dielectric layer 23 have the same height. In an alternative embodiment, referring to FIG. 4E', the frame 21' is less in thickness than the semiconductor chip 22, and the dielectric layer 23 is further formed on the second surface of the frame 21' toward which the inactive surface 22b of the semiconductor chip 22 faces.

In another embodiment, both the active and inactive surfaces 22a, 22b of the semiconductor chip 22 are completely exposed from the dielectric layer 23. The circuit structure 25 is in contact and electrical connection with the active surface 22a of the semiconductor chip 22. Referring to FIG. 3B, the frame 21', the semiconductor chip 22 and the dielectric layer 23 have the same height. In an alternative embodiment, referring to FIG. 4E, the frame 21' is less in thickness than the semiconductor chip 22, and the dielectric layer 23 is further formed on the second surface of the frame 21' toward which the inactive surface 22b of the semiconductor chip 22 faces.

Referring to FIG. 3A', the package structure has a carrier 20. Both the active and inactive surfaces 22a, 22b of the semiconductor chip 22 are completely exposed from the dielectric layer 23. The package structure further has a built-up dielectric layer 23' formed between the dielectric layer 23 and the circuit structure 25 and a plurality of conductors 24 formed in the built-up dielectric layer 23'. The circuit structure 25 formed on the built-up dielectric layer 23' is electrically connected to the active surface 22a of the semiconductor chip 22 through the conductors 24.

Referring to FIG. 3B', the package structure has a carrier 20. Both the active and inactive surfaces 22a, 22b of the semiconductor chip 22 are completely exposed from the dielectric layer 23. The circuit structure 25 is in contact and electrical connection with the active surface 22a of the semiconductor chip 22.

The package structure can further have a plurality of conductive elements 27 formed on the circuit structure 25 and electrically connected the circuit structure 25.

The package structure can further have a substrate 28 disposed on and electrically connected to the circuit structure 25 through the conductive elements 27.

Therefore, the invention replaces the conventional interposer with a cheap circuit structure and dispenses with the conventional solder balls formed between the semiconductor chip and the interposer, thereby effectively reducing the fabrication cost and the thickness of the package structure. Further, since the carrier provides a rigid support to the package structure during formation of the circuit structure or disposing of the substrate, the invention avoids warpage of the package structure. Furthermore, the inactive surface of the semiconductor chip can be exposed for heat dissipation. In addition, since the semiconductor chip is fixed by the frame of the invention, the invention prevents positional deviation of the semiconductor chip during the fabrication process.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   at least a frame having a cavity penetrating therethrough;
   a semiconductor chip received in the cavity of the frame, wherein the semiconductor chip has opposite active and inactive surfaces exposed from the cavity of the frame, and the frame is free from covering the inactive surface of the semiconductor chip;
   a dielectric layer formed in the cavity and on the active surface of the semiconductor chip to contact and fix in position the semiconductor chip, wherein a surface of the dielectric layer is flush with a first surface of the frame toward which the active surface of the semiconductor chip faces, and wherein the inactive surface of the semiconductor chip is completely exposed from the frame and the dielectric layer, wherein the frame is less in thickness than the semiconductor chip, and the dielectric layer is further formed on a second surface of the frame opposite to the first surface thereof toward which the inactive surface of the semiconductor chip faces;
   a plurality of conductors embedded in and in direct contact with the dielectric layer, the conductors being in direct contact with the active surface of the semiconductor chip; and
   a circuit structure formed on the surface of the dielectric layer flush with the first surface of the frame and electrically connected to the active surface of the semiconductor chip through the conductors.

2. A package structure, comprising:
   at least a frame having a cavity penetrating therethrough;
   a semiconductor chip received in the cavity of the frame, wherein the semiconductor chip has opposite active and inactive surfaces exposed from the cavity of the frame, and the frame is free from covering the inactive surface of the semiconductor chip;
   a dielectric layer formed in the cavity to contact and fix in position the semiconductor chip, wherein the frame is less in thickness than the semiconductor chip, a surface of the dielectric layer is flush with a first surface of the frame toward which the active surface of the semiconductor chip faces, the inactive surface of the semiconductor chip is completely exposed from the frame and the dielectric layer, and the dielectric layer is further formed on a second surface of the frame opposite to the first surface thereof toward which the inactive surface of the semiconductor chip faces; and a circuit structure formed on the surface of the dielectric layer flush with the first surface of the frame and electrically connected to the active surface of the semiconductor chip.

3. The structure of claim 2, further comprising a built-up dielectric layer formed between the dielectric layer and the circuit structure, and a plurality of conductors formed in the built-up dielectric layer, such that the circuit structure formed on the built-up dielectric layer is electrically connected to the active surface of the semiconductor chip through the conductors.

4. The structure of claim 2, wherein the circuit structure is in contact and electrical connection with the active surface of the semiconductor chip.

5. The structure of claim 2, wherein a plurality of the semiconductor chips are received in the cavity of the frame and have same or different heights.

6. The structure of claim 2, further comprising a plurality of conductive elements formed on the circuit structure.

7. The structure of claim 6, further comprising a substrate disposed on and electrically connected to the circuit structure through the conductive elements.

* * * * *